United States Patent
Chen et al.

(10) Patent No.: US 11,231,533 B2
(45) Date of Patent: Jan. 25, 2022

(54) OPTICAL ELEMENT HAVING DIELECTRIC LAYERS FORMED BY ION-ASSISTED DEPOSITION AND METHOD FOR FABRICATING THE SAME

(71) Applicant: VisEra Technologies Company Limited, Hsin-Chu (TW)

(72) Inventors: Chang-Wei Chen, Kaohsiung (TW); Chih-Yu Chen, Yunlin County (TW); Chen-Yi Wu, Hsinchu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 721 days.

(21) Appl. No.: 16/033,341

(22) Filed: Jul. 12, 2018

(65) Prior Publication Data
US 2020/0018876 A1 Jan. 16, 2020

(51) Int. Cl.
G02B 5/20 (2006.01)
G02B 5/26 (2006.01)
G02B 5/28 (2006.01)
C23C 14/08 (2006.01)
C23C 14/14 (2006.01)
C23C 14/22 (2006.01)
C23C 14/34 (2006.01)

(52) U.S. Cl.
CPC ............ G02B 5/208 (2013.01); C23C 14/083 (2013.01); C23C 14/14 (2013.01); C23C 14/221 (2013.01); C23C 14/34 (2013.01); G02B 5/286 (2013.01)

(58) Field of Classification Search
CPC ..... C23C 14/083; C23C 14/14; C23C 14/221; C23C 14/34; G02B 5/20; G02B 5/201; G02B 5/208; G02B 5/281; G02B 5/285; G02B 5/286
See application file for complete search history.

(56) References Cited

U.S. PATENT DOCUMENTS

| 5,618,626 A | 4/1997 | Nagashima et al. |
| 6,289,028 B1 * | 9/2001 | Munks ..................... G02B 5/20 372/20 |

(Continued)

FOREIGN PATENT DOCUMENTS

| CN | 1576902 A | 2/2005 |
| CN | 1940599 A | 4/2007 |

(Continued)

OTHER PUBLICATIONS

Office Action issued in corresponding JP application No. 2018-209454 dated May 26, 2020.

*Primary Examiner* — Ryan S Dunning
(74) *Attorney, Agent, or Firm* — Muncy, Geissler, Olds and Lowe, P.C.

(57) ABSTRACT

A method for fabricating an optical element is provided. The fabrication method includes the following steps. A substrate is provided. A plurality of first dielectric layers, a plurality of metal layers of Ag or its alloy and a plurality of second dielectric layers are formed over the substrate. The plurality of first dielectric layers and the plurality of metal layers are alternately formed over the substrate. The plurality of second dielectric layers are formed on one side away from the substrate of the plurality of metal layers and located between the plurality of metal layers and the plurality of first dielectric layers. An optical element fabricated by the method is also provided.

14 Claims, 8 Drawing Sheets

(56) References Cited

U.S. PATENT DOCUMENTS

| | | | | |
|---|---|---|---|---|
| 6,425,987 | B1* | 7/2002 | Lee | C23C 14/0031 |
| | | | | 204/192.11 |
| 10,444,414 | B2* | 10/2019 | Kawaji | C23C 14/06 |
| 2014/0369884 | A1* | 12/2014 | Tauchi | C23C 14/3414 |
| | | | | 420/503 |
| 2015/0029582 | A1* | 1/2015 | Chang | G02B 5/208 |
| | | | | 359/360 |
| 2018/0217303 | A1* | 8/2018 | Kawaji | C23C 14/06 |
| 2018/0299700 | A1* | 10/2018 | Takashi | G02C 7/061 |

FOREIGN PATENT DOCUMENTS

| | | |
|---|---|---|
| CN | 101151557 A | 3/2008 |
| CN | 101226244 A | 7/2008 |
| CN | 101261333 A | 9/2008 |
| CN | 104871047 A | 8/2015 |
| CN | 105759334 A | 7/2016 |
| CN | 107831564 A | 3/2018 |
| JP | 2009-134064 A | 6/2009 |
| JP | 2012-108204 A | 6/2012 |
| JP | 2015-119046 A | 6/2015 |
| JP | 2015-147366 A | 8/2015 |
| JP | 2015-149511 A | 8/2015 |
| JP | 2017-168822 A | 9/2017 |
| JP | 2017-526945 A | 9/2017 |
| JP | 2017-214607 A | 12/2017 |
| JP | 2019-521376 A | 7/2019 |
| TW | 200807701 A | 2/2008 |
| WO | WO-2014/188913 A1 | 11/2014 |
| WO | WO 2017/218433 A1 | 12/2017 |

\* cited by examiner

| | Va (V) | Vb (V) | Ib (mA) | Ie (mA) | Ik (mA) | Ar (sccm) | O2 (sccm) |
|---|---|---|---|---|---|---|---|
| High-power IAD | 300~800 | 1000~1500 | 1000~1500 | 1000~1500 | 300~600 | 10~50 | 10~80 |

FIG. 3

| | Va (V) | Vb (V) | Ib (mA) | Ie (mA) | Ik (mA) | Ar (sccm) | O2 (sccm) |
|---|---|---|---|---|---|---|---|
| Low-power IAD | 300~800 | 100~500 | 100~800 | 100~800 | 400~600 | 10~50 | 0 |

FIG. 4

| Layer | Material | Thickness (nm) |
|---|---|---|
| 14f | NbTiOx (x=2-5) | 50-150 |
| 18e | NbTiOx (x<2) | 3-10 |
| 16e | Ag alloy | 10-30 |
| 14e | NbTiOx (x=2-5) | 10-60 |
| 18d | NbTiOx (x<2) | 3-10 |
| 16d | Ag alloy | 10-30 |
| 14d | NbTiOx (x=2-5) | 10-60 |
| 18c | NbTiOx (x<2) | 3-10 |
| 16c | Ag alloy | 10-30 |
| 14c | NbTiOx (x=2-5) | 10-60 |
| 18b | NbTiOx (x<2) | 3-10 |
| 16b | Ag alloy | 10-30 |
| 14b | NbTiOx (x=2-5) | 10-60 |
| 18a | NbTiOx (x<2) | 3-10 |
| 16a | Ag alloy | 10-30 |
| 14a | NbTiOx (x=2-5) | 10-60 |

FIG. 5

OPTICAL ELEMENT HAVING DIELECTRIC LAYERS FORMED BY ION-ASSISTED DEPOSITION AND METHOD FOR FABRICATING THE SAME

BACKGROUND OF THE INVENTION

Field of the Invention

The invention relates to a fabrication method of an optical element, and more particularly to a fabrication method of an optical element using high/low-power ion-assisted deposition (IAD) to fabricate dielectric layers, and an optical element fabricated thereby.

Description of the Related Art

In addition to transmitting visible light, both dye-based and all-dielectric color filters also transmit infrared (IR) light, which contributes to noise. Therefore, a color image sensor, typically, also includes an IR-blocking filter disposed over a color filter array (CFA).

Alternatively, in order to avoid the use of an IR-blocking filter, induced transmission filters formed of stacked metal and dielectric layers may be used as color filters. Such metal-dielectric color filters are inherently IR-blocking. Typically, the metal-dielectric color filters have relatively narrow color passbands that do not shift significantly in wavelength with changes in incidence angle. Furthermore, the metal-dielectric color filters are generally much thinner than all-dielectric color filters.

Typically, the metal layers in the metal-dielectric color filters are silver layers, which are environmentally unstable and which deteriorate when exposed to even small amounts of water or oxygen. Chemically etching the silver layers exposes the silver layers to the environment, allowing deterioration. Therefore, in most instances, the metal-dielectric CFAs are patterned by adjusting the thickness of only the dielectric layers to select different color passbands for the metal-dielectric color filters. In other words, different types of metal-dielectric color filters having different color passbands are required to have the same number of silver layers as one another and the same thickness of the silver layers as one another. Unfortunately, these requirements severely limit the possible optical designs for the metal-dielectric color filters.

Therefore, development of a simple fabrication method of an optical element which is capable of improving the reliability of silver layers in metal-dielectric color filters is desirable.

BRIEF SUMMARY OF THE INVENTION

In accordance with one embodiment of the invention, a method for fabricating an optical element is provided. The fabrication method comprises the following steps. A substrate is provided. A plurality of first dielectric layers, a plurality of metal layers of Ag or its alloy and a plurality of second dielectric layers are formed over the substrate. The plurality of first dielectric layers and the plurality of metal layers are alternately formed over the substrate. The plurality of second dielectric layers are formed on one side away from the substrate of the plurality of metal layers and located between the plurality of metal layers and the plurality of first dielectric layers.

In some embodiments, the plurality of first dielectric layers are formed by performing high-power ion-assisted deposition. In some embodiments, the high-power ion-assisted deposition has a beam voltage which is in a range from about 1,000V to about 1,500V. In some embodiments, the high-power ion-assisted deposition has a beam current which is in a range from about 1,000 mA to about 1,500 mA.

In some embodiments, the plurality of metal layers are formed by performing sputtering. In some embodiments, the sputtering uses AgZn alloy, AgAl alloy, AgIn AgCu alloy or pure Ag as a target. In some embodiments, Zn has a content of about 1-10% in the target of AgZn alloy.

In some embodiments, the plurality of second dielectric layers are formed by performing low-power ion-assisted deposition. In some embodiments, the low-power ion-assisted deposition has a beam voltage which is in a range from about 100V to about 500V. In some embodiments, the low-power ion-assisted deposition has a beam current which is in a range from about 100 mA to about 800 mA. In some embodiments, the low-power ion-assisted deposition is performed without introduction of oxygen.

In accordance with one embodiment of the invention, an optical element is provided. An optical element comprises a substrate, a plurality of first dielectric layers, a plurality of metal layers of Ag or its alloy, and a plurality of second dielectric layers. The plurality of first dielectric layers are formed over the substrate. The plurality of metal layers of Ag or its alloy are formed in alternation with the plurality of first dielectric layers. The plurality of second dielectric layers are formed on one side away from the substrate of the plurality of metal layers and located between the plurality of metal layers and the plurality of first dielectric layers.

In some embodiments, the first dielectric layers comprise $NbTiO_x$ (x=2-5) or $Ti_3O_5$. In some embodiments, the first dielectric layers have a refractive index which is in a range from about 2.10 to about 2.96. In some embodiments, the first dielectric layers have a thickness which is in a range from about 10 nm to about 60 nm.

In some embodiments, the metal layers comprise AgZn alloy, AgAl alloy, AgIn alloy, AgCu alloy or pure Ag. In some embodiments, the metal layers have a thickness which is in a range from about 10 nm to about 30 nm.

In some embodiments, the second dielectric layers comprise $NbTiO_x$ (x<2) or $Ti_3O_5$. In some embodiments, the second dielectric layers have a light absorption rate which is in a range from about 0.05 to about 0.96. In some embodiments, the second dielectric layers have a thickness which is in a range from about 3 nm to about 10 nm.

In some embodiments, the plurality of first dielectric layers, the plurality of metal layers and the plurality of second dielectric layers constitute an optical filter. In some embodiments, the optical filter comprises an IR-cut filter, a red color filter, a green color filter or a blue color filter.

In the present fabrication method, the plurality of metal layers are formed by performing sputtering using various Ag/metal alloys with appropriate Ag/metal ratios as targets, which improves the reliability of the metal layers. The plurality of dense first dielectric layers are formed by performing the high-power IAD and located at one side of the metal layers to suppress silver diffusion from the metal layers after high-temperature processes. The plurality of thin second dielectric layers are formed by performing the low-power IAD without introduction of oxygen and located at one side away from the substrate of the metal layers to prevent the metal layers from oxidation and ion bombardment. Therefore, the plurality of metal layers of Ag or its alloy have high reliability due to disposing the first and second dielectric layers on the both sides thereof. Furthermore, the materials (for example $NbTiO_x$ or $Ti_3O_5$) of the first and second dielectric layers are the same or different and are distinct from those of conventional dielectric layers. In addition, by adjusting the number and thickness of the first dielectric layers, the metal layers, and the second dielectric layers, various optical filters, for example an IR-cut filter, a red (R) color filter, a green (G) color filter, a blue (B) color filter or a filter which is capable of cutting any wavelength range, are thus prepared.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3 shows process conditions of a high-power ion-assisted deposition in accordance with one embodiment of the invention;

FIG. 4 shows process conditions of a low-power ion-assisted deposition in accordance with one embodiment of the invention;

FIG. 5 shows material and thickness of each layer of an optical filter in accordance with one embodiment of the invention.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
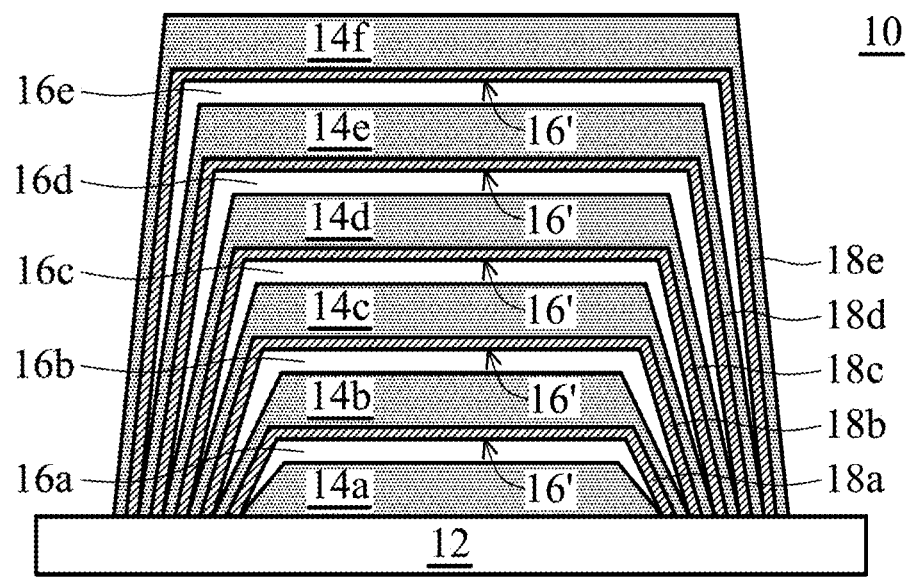
FIG. 1 is a cross-sectional view of an optical element in accordance with one embodiment of the invention.

Referring to FIG. 1, in accordance with one embodiment of the invention, an optical element 10 is provided. FIG. 1 shows a cross-sectional view of the optical element 10.

The optical element 10 comprises a substrate 12, a plurality of first dielectric layers (14a, 14b, 14c, 14d, 14e and 14f), a plurality of metal layers (16a, 16b, 16c, 16d and 16e) of Ag or its alloy, and a plurality of second dielectric layers (18a, 18b, 18c, 18d and 18e). The plurality of first dielectric layers (14a, 14b, 14c, 14d, 14e and 14f) are formed over the substrate 12. The plurality of metal layers (16a, 16b, 16c, 16d and 16e) of Ag or its alloy are formed in alternation with the plurality of first dielectric layers (14a, 14b, 14c, 14d and 14e). The plurality of second dielectric layers (18a, 18b, 18c, 18d and 18e) are formed on one side 16' away from the substrate 12 of the plurality of metal layers (16a, 16b, 16c, 16d and 16e) and located between the plurality of metal layers (16a, 16b, 16c, 16d and 16e) and the plurality of first dielectric layers (14b, 14c, 14d, 14e and 14f).

In some embodiments, the first dielectric layers (14a, 14b, 14c, 14d, 14e and 140) may comprise NbTiOx (x=2-5) or Ti3O5.

In some embodiments, the first dielectric layers (14a, 14b, 14c, 14d, 14e and 140) have a refractive index (n) which is in a range from about 2.10 to about 2.96.

In some embodiments, the first dielectric layers (14a, 14b, 14c, 14d and 14e) have a thickness which is in a range from about 10 nm to about 60 nm.

In some embodiments, the uppermost first dielectric layer 14f has a thickness which is in a range from about 50 nm to about 150 nm.

In some embodiments, the first dielectric layers (14a, 14b, 14c, 14d, 14e and 140) have a dense quality. The "dense" means a state in which the voids in the first dielectric layers are small and there are almost no voids.

In some embodiments, the metal layers (16a, 16b, 16c, 16d and 16e) may comprise AgZn alloy, AgAl alloy, AgIn alloy, AgCu alloy, pure Ag, or another suitable Ag alloy.

In some embodiments, the metal layers (16a, 16b, 16c, 16d and 16e) have a thickness which is in a range from about 10 nm to about 30 nm.

In some embodiments, the second dielectric layers (18a, 18b, 18c, 18d and 18e) may comprise NbTiOx (x<2) or Ti3O5.

In some embodiments, the second dielectric layers (18a, 18b, 18c, 18d and 18e) have a light absorption rate (k) which is in a range from about 0.05 to about 0.96.

In some embodiments, the second dielectric layers (18a, 18b, 18c, 18d and 18e) have a thickness which is in a range from about 3 nm to about 10 nm.

In some embodiments, the plurality of first dielectric layers (14a, 14b, 14c, 14d, 14e and 140, the plurality of metal layers (16a, 16b, 16c, 16d and 16e) and the plurality of second dielectric layers (18a, 18b, 18c, 18d and 18e) may constitute an optical filter 20.

In some embodiments, by adjusting the number and thickness of the first dielectric layers (14a, 14b, 14c, 14d, 14e and 140, the metal layers (16a, 16b, 16c, 16d and 16e), and the second dielectric layers (18a, 18b, 18c, 18d and 18e), the optical filter 20 may be formed as an IR-cut filter, a red (R) color filter, a green (G) color filter, a blue (B) color filter or a filter which is capable of cutting any wavelength range.

Referring to FIGS. 2A-2H, in accordance with one embodiment of the invention, a method for fabricating the optical element 10 of FIG. 1 is provided. FIGS. 2A-2H show cross-sectional views of the method for fabricating the optical element 10.

Figure 2A:
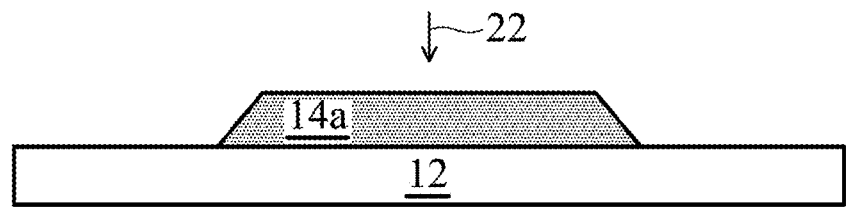
FIGS. 2A-2H are cross-sectional views of a method for fabricating an optical element in accordance with one embodiment of the invention.

Referring to FIG. 2A, a substrate 12 with a first dielectric layer 14a formed thereon is provided.

In some embodiments, the first dielectric layer 14a may be formed by performing high-power ion-assisted deposition (high-power IAD) 22.

The process conditions, for example, a beam voltage (Vb), a beam current (Ib), an accelerate voltage (Va), an emission current (Ie), a keeper current (1k) and a flow rate of a process gas, of the high-power ion-assisted deposition 22 are shown in FIG. 3.

In some embodiments, the beam voltage (Vb) of the high-power IAD 22 is in a range from about 1,000V to about 1,500V.

In some embodiments, the beam current (Ib) of the high-power IAD 22 is in a range from about 1,000 mA to about 1,500 mA.

In some embodiments, the accelerate voltage (Va) of the high-power IAD 22 is in a range from about 300V to about 800V.

In some embodiments, the emission current (Ie) of the high-power LAD 22 is in a range from about 1,000 mA to about 1,500 mA.

In some embodiments, the keeper current (Ik) of the high-power IAD 22 is in a range from about 300 mA to about 600 mA.

In some embodiments, the process gases used in the high-power IAD 22 are oxygen and argon.

In some embodiments, in the high-power IAD 22, the flow rate of oxygen is in a range from about 10 sccm to about 80 sccm.

In some embodiments, in the high-power IAD 22, the flow rate of argon is in a range from about 10 sccm to about 50 sccm.

In some embodiments, the first dielectric layer 14a may comprise NbTiOx or Ti3O5.

In some embodiments, the first dielectric layer 14a has a refractive index (n) which is in a range from about 2.10 to about 2.96.

In some embodiments, the first dielectric layer 14a has a dense quality.

In some embodiments, the first dielectric layer 14a has a thickness which is in a range from about 10 nm to about 60 nm.

Figure 2B:
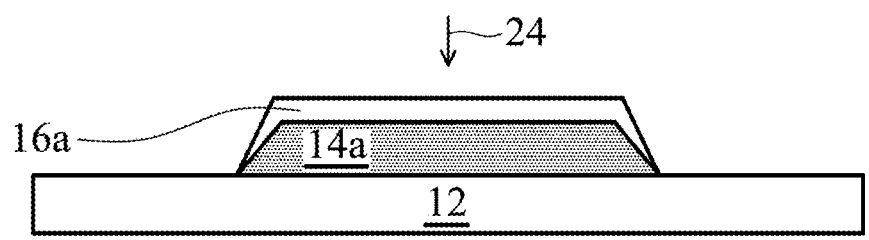

Referring to FIG. 2B, a metal layer 16a of Ag or its alloy is then formed on the first dielectric layer 14a.

In some embodiments, the metal layer 16a of Ag or its alloy may be formed by performing sputtering 24.

In some embodiments, the sputtering 24 uses AgZn alloy, AgAl alloy, AgIn alloy, AgCu alloy, pure Ag, or another suitable Ag alloy as a target.

In some embodiments, Zn has a content of about 1-10% in the target of AgZn alloy.

In some embodiments, Zn has a content of about 3% in the target of AgZn alloy.

In some embodiments, the metal layer 16a may comprise AgZn alloy, AgAl AgIn alloy, AgCu alloy, pure Ag, or another suitable Ag alloy.

In some embodiments, the metal layer 16a has a thickness which is in a range from about 10 nm to about 30 nm.

Figure 2C:
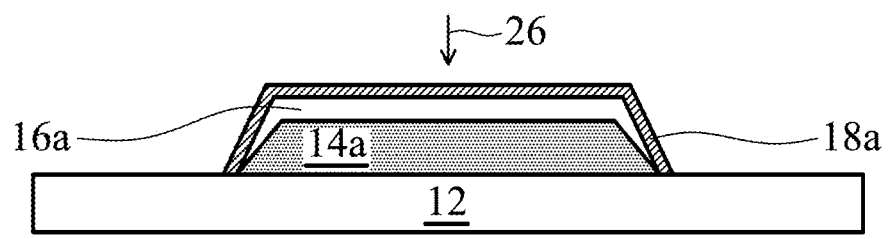

Referring to FIG. 2C, a second dielectric layer 18a is then formed on the metal layer 16a.

In some embodiments, the second dielectric layer 18a may be formed by performing low-power ion-assisted deposition (low-power IAD) 26.

The process conditions, for example, a beam voltage (Vb), a beam current (Ib), an accelerate voltage (Va), an emission current (Ie), a keeper current (Ik) and a flow rate of a process gas, of the low-power ion-assisted deposition 26 are shown in FIG. 4.

In some embodiments, the beam voltage (Vb) of the low-power IAD 26 is in a range from about 100V to about 500V.

In some embodiments, the beam current (Ib) of the low-power IAD 26 is in a range from about 100 mA to about 800 mA.

In some embodiments, the accelerate voltage (Va) of the low-power IAD 26 is in a range from about 300V to about 800V.

In some embodiments, the emission current (Ie) of the low-power IAD 26 is in a range from about 100 mA to about 800 mA.

In some embodiments, the keeper current (Ik) of the low-power IAD 26 is in a range from about 400 mA to about 600 mA.

In some embodiments, the process gas used in the low-power IAD 26 is argon.

In some embodiments, in the low-power IAD 26, the flow rate of argon is in a range from about 10 sccm to about 50 sccm.

In some embodiments, in the low-power IAD 26, no oxygen is used.

In some embodiments, the second dielectric layer 18a may comprise NbTiOx (x<2) or Ti3O5.

In some embodiments, the second dielectric layer 18a has a light absorption rate (k) which is in a range from about 0.05 to about 0.96.

In some embodiments, the second dielectric layer 18a has a thickness which is in a range from about 3 nm to about 10 nm.

Figure 2D:
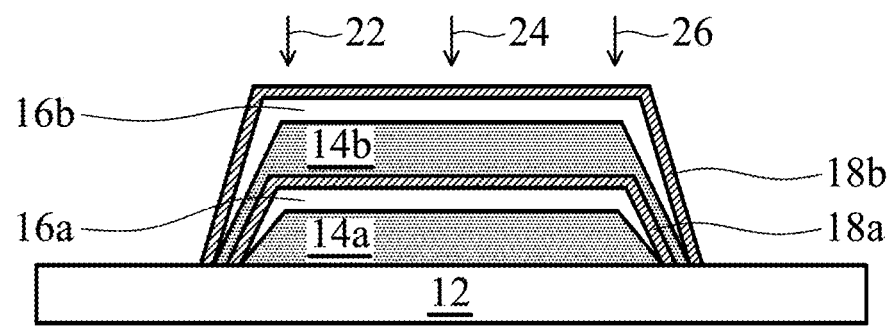

Referring to FIG. 2D, a first dielectric layer 14b, a metal layer 16b of Ag or its alloy and a second dielectric layer 18b are then formed on the second dielectric layer 18a in order.

In some embodiments, the first dielectric layer 14b may be formed by performing high-power ion-assisted deposition (high-power IAD) 22.

In some embodiments, the parameters, for example a beam voltage (Vb), a beam current (Ib), an accelerate voltage (Va), an emission current (Ie), a keeper current (Ik), process gases, and a flow rate, of the high-power IAD 22 performed on the first dielectric layer 14b are similar to those of the high-power IAD 22 performed on the first dielectric layer 14a.

In some embodiments, the composition, refractive index (n), density, and thickness, of the first dielectric layer 14b are similar to those of the first dielectric layer 14a.

In some embodiments, the metal layer 16b of Ag or its alloy may be formed by performing sputtering 24.

In some embodiments, the targets used in the sputtering 24 which is performed on the metal layer 16b are similar to those used in the sputtering 24 which is performed on the metal layer 16a.

In some embodiments, Zn has a content of about 1-10% in the target of AgZn alloy.

In some embodiments, Zn has a content of about 3% in the target of AgZn alloy.

In some embodiments, the composition and thickness of the metal layer 16b are similar to those of the metal layer 16a.

In some embodiments, the second dielectric layer 18b may be formed by performing low-power ion-assisted deposition (low-power IAD) 26.

In some embodiments, the parameters, for example a beam voltage (Vb), a beam current (Ib), an accelerate voltage (Va), an emission current (Ie), a keeper current (Ik), a process gas, and a flow rate, of the low-power IAD 26 performed on the second dielectric layer 18b are similar to those of the low-power IAD 26 performed on the second dielectric layer 18a.

In some embodiments, the composition, light absorption rate (k), and thickness, of the second dielectric layer 18b are similar to those of the second dielectric layer 18a.

Figure 2E:
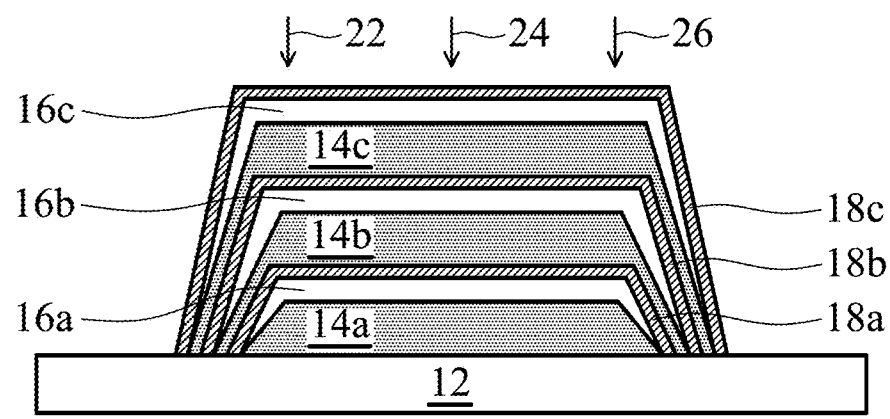

Referring to FIG. 2E, a first dielectric layer 14c, a metal layer 16c of Ag or its alloy and a second dielectric layer 18c are then formed on the second dielectric layer 18b in order.

In some embodiments, the first dielectric layer 14c may be formed by performing high-power ion-assisted deposition (high-power IAD) 22.

In some embodiments, the parameters, for example a beam voltage (Vb), a beam current (Ib), an accelerate voltage (Va), an emission current (Ie), a keeper current (Ik), process gases, and a flow rate, of the high-power IAD 22 performed on the first dielectric layer 14c are similar to those of the high-power IAD 22 performed on the first dielectric layer 14a.

In some embodiments, the composition, refractive index (n), density, and thickness, of the first dielectric layer 14c are similar to those of the first dielectric layer 14a.

In some embodiments, the metal layer 16c of Ag or its alloy may be formed by performing sputtering 24.

In some embodiments, the targets used in the sputtering 24 which is performed on the metal layer 16c are similar to those used in the sputtering 24 which is performed on the metal layer 16a.

In some embodiments, Zn has a content of about 1-10% in the target of AgZn alloy.

In some embodiments, Zn has a content of about 3% in the target of AgZn alloy.

In some embodiments, the composition and thickness of the metal layer 16c are similar to those of the metal layer 16a.

In some embodiments, the second dielectric layer 18c may be formed by performing low-power ion-assisted deposition (low-power IAD) 26.

In some embodiments, the parameters, for example a beam voltage (Vb), a beam current (Ib), an accelerate voltage (Va), an emission current (Ie), a keeper current (Ik), a process gas, and a flow rate, of the low-power IAD 26 performed on the second dielectric layer 18c are similar to those of the low-power IAD 26 performed on the second dielectric layer 18a.

In some embodiments, the composition, light absorption rate (k), and thickness, of the second dielectric layer 18c are similar to those of the second dielectric layer 18a.

Figure 2F:
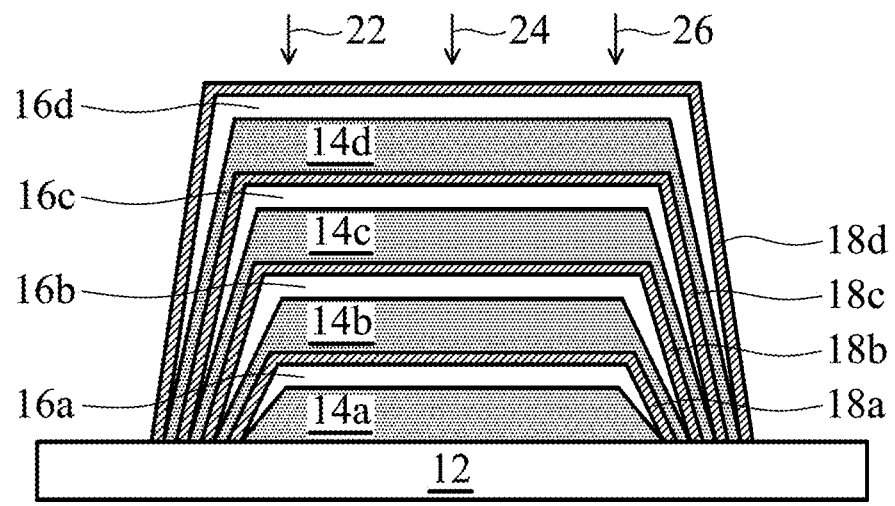

Referring to FIG. 2F, a first dielectric layer 14d, a metal layer 16d of Ag or its alloy and a second dielectric layer 18d are then formed on the second dielectric layer 18c in order.

In some embodiments, the first dielectric layer 14d may be formed by performing high-power ion-assisted deposition (high-power IAD) 22.

In some embodiments, the parameters, for example a beam voltage (Vb), a beam current (Ib), an accelerate voltage (Va), an emission current (Ie), a keeper current (Ik), process gases, and a flow rate, of the high-power IAD 22 performed on the first dielectric layer 14d are similar to those of the high-power LAD 22 performed on the first dielectric layer 14a.

In some embodiments, the composition, refractive index (n), density, and thickness, of the first dielectric layer 14d are similar to those of the first dielectric layer 14a.

In some embodiments, the metal layer 16d of Ag or its alloy may be formed by performing sputtering 24.

In some embodiments, the targets used in the sputtering 24 which is performed on the metal layer 16d are similar to those used in the sputtering 24 which is performed on the metal layer 16a.

In some embodiments, Zn has a content of about 1-10% in the target of AgZn alloy.

In some embodiments, Zn has a content of about 3% in the target of AgZn alloy.

In some embodiments, the composition and thickness of the metal layer 16d are similar to those of the metal layer 16a.

In some embodiments, the second dielectric layer 18d may be foil ied by performing low-power ion-assisted deposition (low-power IAD) 26.

In some embodiments, the parameters, for example a beam voltage (Vb), a beam current (Ib), an accelerate voltage (Va), an emission current (Ie), a keeper current (Ik), a process gas, and a flow rate, of the low-power IAD 26 performed on the second dielectric layer 18d are similar to those of the low-power IAD 26 performed on the second dielectric layer 18a.

In some embodiments, the composition, light absorption rate (k), and thickness, of the second dielectric layer 18d are similar to those of the second dielectric layer 18a.

Figure 2G:
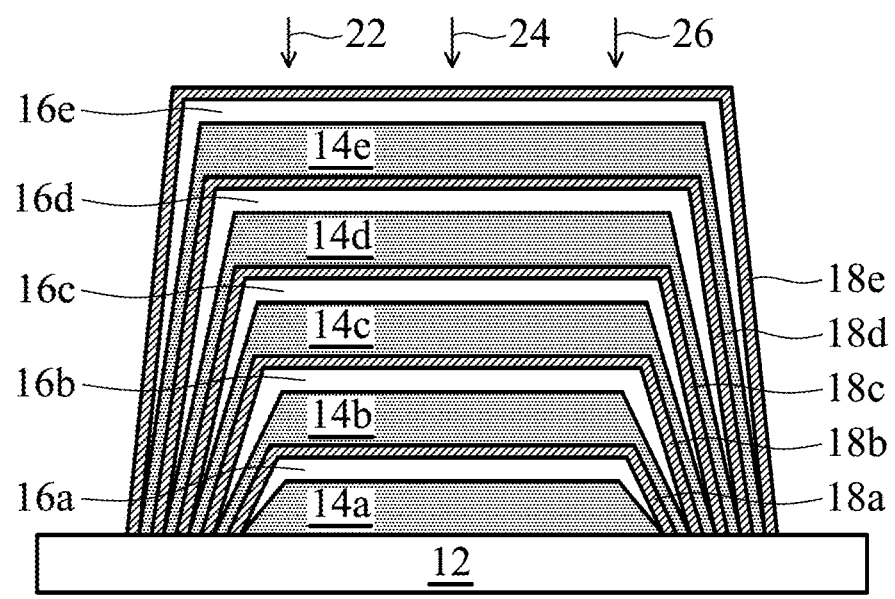

Referring to FIG. 2G, a first dielectric layer 14e, a metal layer 16e of Ag or its alloy and a second dielectric layer 18e are then formed on the second dielectric layer 18d in order.

In some embodiments, the first dielectric layer 14e may be formed by performing high-power ion-assisted deposition (high-power IAD) 22.

In some embodiments, the parameters, for example a beam voltage (Vb), a beam current (Ib), an accelerate voltage (Va), an emission current (Ie), a keeper current (Ik), process gases, and a flow rate, of the high-power IAD 22 performed on the first dielectric layer 14e are similar to those of the high-power IAD 22 performed on the first dielectric layer 14a.

In some embodiments, the composition, refractive index (n), density, and thickness, of the first dielectric layer 14e are similar to those of the first dielectric layer 14a.

In some embodiments, the metal layer 16e of Ag or its alloy may be formed by performing sputtering 24.

In some embodiments, the targets used in the sputtering 24 which is performed on the metal layer 16e are similar to those used in the sputtering 24 which is performed on the metal layer 16a.

In some embodiments, Zn has a content of about 1-10% in the target of AgZn alloy.

In some embodiments, Zn has a content of about 3% in the target of AgZn alloy.

In some embodiments, the composition and thickness of the metal layer 16e are similar to those of the metal layer 16a.

In some embodiments, the second dielectric layer 18e may be formed by performing low-power ion-assisted deposition (low-power IAD) 26.

In some embodiments, the parameters, for example a beam voltage (Vb), a beam current (Ib), an accelerate voltage (Va), an emission current (Ie), a keeper current (Ik), a process gas, and a flow rate, of the low-power IAD 26 performed on the second dielectric layer 18e are similar to those of the low-power IAD 26 performed on the second dielectric layer 18a.

In some embodiments, the composition, light absorption rate (k), and thickness, of the second dielectric layer 18e are similar to those of the second dielectric layer 18a.

Figure 2H:
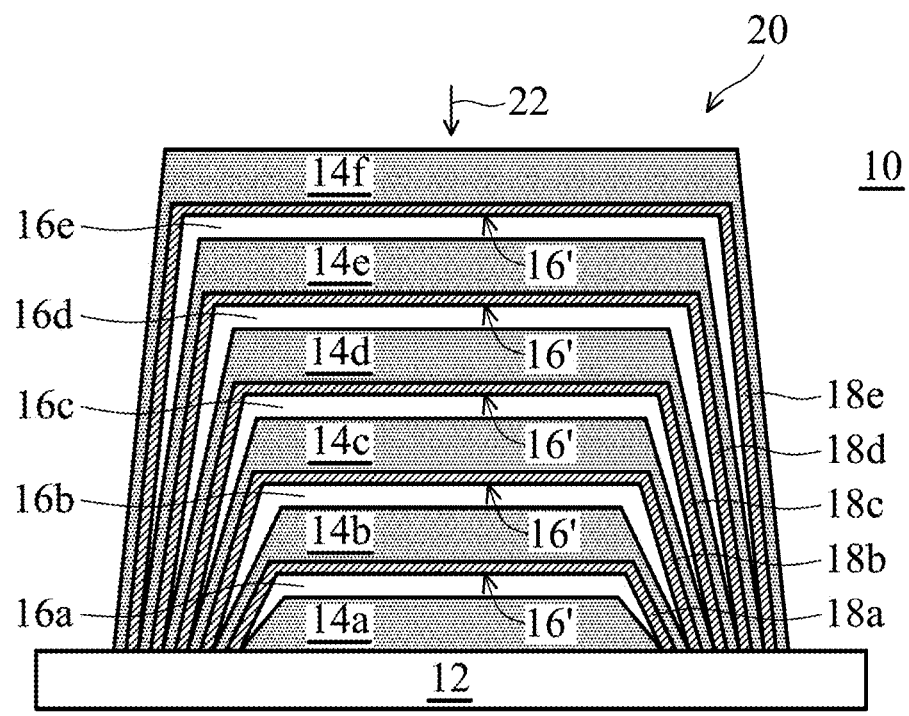

Referring to FIG. 2H, a first dielectric layer 14f is then formed on the second dielectric layer 18e.

In some embodiments, the first dielectric layer 14f may be formed by performing high-power ion-assisted deposition (high-power IAD) 22.

In some embodiments, the parameters, for example a beam voltage (Vb), a beam current (Ib), an accelerate voltage (Va), an emission current (Ie), a keeper current (Ik), process gases, and a flow rate, of the high-power IAD 22 performed on the first dielectric layer 14f are similar to those of the high-power IAD 22 performed on the first dielectric layer 14a.

In some embodiments, the composition, refractive index (n), and density of the first dielectric layer 14f are similar to those of the first dielectric layer 14a.

In some embodiments, the first dielectric layer 14f has a thickness which is in a range from about 50 nm to about 150 nm.

In FIG. 2H, the plurality of metal layers (16a, 16b, 16c, 16d and 16e) of Ag or its alloy are formed in alternation with the plurality of first dielectric layers (14a, 14b, 14c, 14d and 14e). The plurality of second dielectric layers (18a, 18b, 18c, 18d and 18e) are formed on one side 16' away from the substrate 12 of the plurality of metal layers (16a, 16b, 16c, 16d and 16e) and located between the plurality of metal layers (16a, 16b, 16c, 16d and 16e) and the plurality of first dielectric layers (14b, 14c, 14d, 14e and 14f).

In FIG. 2H, the plurality of first dielectric layers (14a, 14b, 14c, 14d, 14e and 14f), the plurality of metal layers (16a, 16b, 16c, 16d and 16e) and the plurality of second dielectric layers (18a, 18b, 18c, 18d and 18e) may constitute an optical filter 20.

In summary, the material and thickness of each layer of the optical filter 20 are shown in FIG. 5.

In some embodiments, by adjusting the number and thickness of the first dielectric layers (14a, 14b, 14c, 14d, 14e and 14f), the metal layers (16a, 16b, 16c, 16d and 16e), and the second dielectric layers (18a, 18b, 18c, 18d and 18e), the optical filter 20 may be formed as an IR-cut filter, a red (R) color filter, a green (G) color filter, a blue (B) color filter or a filter which is capable of cutting any wavelength range.

Figure 6:
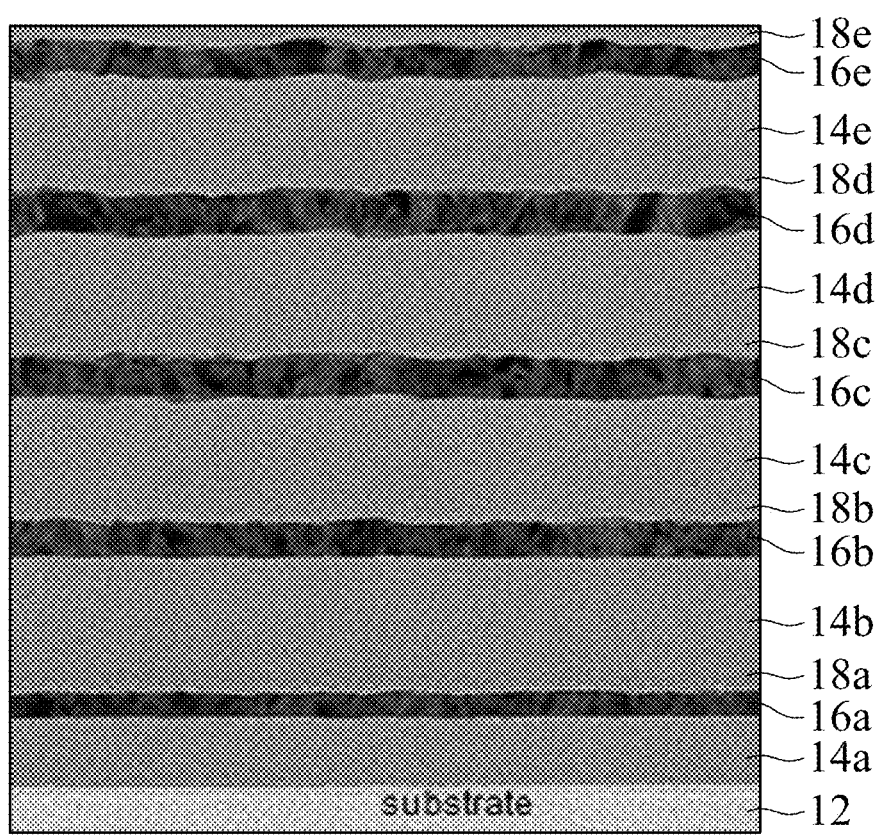
FIG. 6 shows a TEM of a part of an optical filter in accordance with one embodiment of the invention.

The TEM data of a part of the optical filter 20 is shown in FIG. 6. The plurality of first dielectric layers (14a, 14b, 14c, 14d and 14e) located at one side of the metal layers (16a, 16b, 16c, 16d and 16e) can suppress silver diffusion from the metal layers (16a, 16b, 16c, 16d and 16e) after high-temperature processes. In addition, the plurality of second dielectric layers (18a, 18b, 18c, 18d and 18e) located at one side of the metal layers (16a, 16b, 16c, 16d and 16e) away from the substrate 12 can prevent the metal layers (16a, 16b, 16c, 16d and 16e) from oxidation and ion bombardment. Therefore, in FIG. 6, there is no silver atom into the plurality of first dielectric layers (14a, 14b, 14c, 14d and 14e) and the plurality of second dielectric layers (18a, 18b, 18c, 18d and 18e).

In the present fabrication method, the plurality of metal layers are formed by performing sputtering using various Ag/metal alloys with appropriate Ag/metal ratios as targets, which improves the reliability of the metal layers. The plurality of dense first dielectric layers are formed by performing the high-power IAD and located at one side of the metal layers to suppress silver diffusion from the metal layers after high-temperature processes. The plurality of thin second dielectric layers are formed by performing the low-power IAD without introduction of oxygen and located at one side away from the substrate of the metal layers to prevent the metal layers from oxidation and ion bombardment. Therefore, the plurality of metal layers of Ag or its alloy have high reliability due to disposing the first and second dielectric layers on the both sides thereof. Furthermore, the materials (for example NbTiOx or Ti3O5) of the first and second dielectric layers are the same or different and are distinct from those of conventional dielectric layers. In addition, by adjusting the number and thickness of the first dielectric layers, the metal layers, and the second dielectric layers, various optical filters, for example an IR-cut filter, a red (R) color filter, a green (G) color filter, a blue (B) color filter or a filter which is capable of cutting any wavelength range, are thus prepared.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an optical element, comprising:
   providing a substrate; and
   forming a plurality of first dielectric layers, a plurality of metal layers of Ag or its alloy and a plurality of second dielectric layers over the substrate, wherein the plurality of first dielectric layers and the plurality of metal layers are alternately formed over the substrate, and the plurality of second dielectric layers are formed on one side away from the substrate of the plurality of metal layers and between the plurality of metal layers and the plurality of first dielectric layers, wherein the plurality of first dielectric layers are formed by performing high-power ion-assisted deposition and the plurality of second dielectric layers are formed by performing low-power ion-assisted deposition, wherein the high-power ion-assisted deposition has a beam voltage which is in a range from about 1,000V to about 1,500V and has a beam current which is in a range from about 1,000 mA to about 1,500 mA, and the low-power ion-assisted deposition has a beam voltage which is in a range from about 100V to about 500V and has a beam current which is in a range from about 100 mA to about 800 mA.

2. The method for fabricating an optical element as claimed in claim 1, wherein the plurality of metal layers are formed by performing sputtering.

3. The method for fabricating an optical element as claimed in claim 2, wherein the sputtering uses AgZn alloy, AgAl alloy, AgIn alloy, AgCu alloy, or pure Ag as a target.

4. The method for fabricating an optical element as claimed in claim 3, wherein the sputtering uses AgZn alloy as a target, and Zn has a content of about 1-10% in the target.

5. The method for fabricating an optical element as claimed in claim 1, wherein the low-power ion-assisted deposition is performed without introduction of oxygen.

6. An optical element, comprising:
   a substrate;
   a plurality of first dielectric layers formed over the substrate, wherein the plurality of first dielectric layers are formed by performing high-power ion-assisted deposition, wherein the high-power ion-assisted deposition has a beam voltage which is in a range from about 1,000V to about 1,500V and has a beam current which is in a range from about 1,000 mA to about 1,500 mA;
   a plurality of metal layers of Ag or its alloy formed in alternation with the plurality of first dielectric layers; and
   a plurality of second dielectric layers formed on one side away from the substrate of the plurality of metal layers and between the plurality of metal layers and the plurality of first dielectric layers, wherein the plurality of second dielectric layers are formed by performing low-power ion-assisted deposition, wherein the low-power ion-assisted deposition has a beam voltage which is in a range from about 100V to about 500V and has a beam current which is in a range from about 100 mA to about 800 mA.

7. The optical element as claimed in claim 6, wherein the first dielectric layers comprise $NbTiO_x$ (x=2-5) or $Ti_3O_5$.

8. The optical element as claimed in claim 6, wherein the first dielectric layers have a refractive index which is in a range from about 2.10 to about 2.96, and the first dielectric layers have a thickness which is in a range from about 10 nm to about 60 nm.

9. The optical element as claimed in claim 6, wherein the metal layers comprise AgZn alloy, AgAl alloy, AgIn alloy, AgCu alloy or pure Ag.

10. The optical element as claimed in claim 6, wherein the metal layers have a thickness which is in a range from about 10 nm to about 30 nm.

11. The optical element as claimed in claim 6, wherein the second dielectric layers comprise $NbTiO_x$ (x<2) or $Ti_3O_5$.

12. The optical element as claimed in claim 6, wherein the second dielectric layers have a light absorption rate which is in a range from about 0.05 to about 0.96.

13. The optical element as claimed in claim 6, wherein the second dielectric layers have a thickness which is in a range from about 3 nm to about 10 nm.

14. The optical element as claimed in claim 6, wherein the plurality of first dielectric layers, the plurality of metal layers and the plurality of second dielectric layers constitute an optical filter comprising an IR-cut filter, a red color filter, a green color filter or a blue color filter.

* * * * *